(12) United States Patent
Hata et al.

(10) Patent No.: US 6,940,099 B2
(45) Date of Patent: Sep. 6, 2005

(54) SEMICONDUCTOR LIGHT EMITTING ELEMENT AND SEMICONDUCTOR LIGHT EMITTING DEVICE

(75) Inventors: Toshio Hata, Nara (JP); Kensaku Yamamoto, Hiroshima (JP); Mayuko Fudeta, Hiroshima (JP); Masaki Tatsumi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/243,321

(22) Filed: Sep. 13, 2002

(65) Prior Publication Data
US 2003/0062534 A1 Apr. 3, 2003

(30) Foreign Application Priority Data
Sep. 14, 2001 (JP) .................................. 2001-278983

(51) Int. Cl.$^7$ ................................................ H01L 33/00
(52) U.S. Cl. .................................... 257/98; 257/99
(58) Field of Search ...................................... 257/98, 99

(56) References Cited
U.S. PATENT DOCUMENTS 4,316,208 A * 2/1982 Kobayashi et al. ............ 257/98
5,760,423 A * 6/1998 Kamakura et al. ............ 257/99
6,369,506 B1 * 4/2002 Hata ............................ 313/499
6,794,684 B2 * 9/2004 Slater et al. .................. 257/77

FOREIGN PATENT DOCUMENTS

| CN | 1218996 | 6/1999 |
|----|---------|--------|
| JP | 05343742 A | 12/1993 |
| JP | 2000-183400 | 6/2000 |

OTHER PUBLICATIONS

Chinese Office Action mailed May 28, 2004, for Chinese Patent Application 02142952.9 filed Sep. 14, 2001, 13 pages.

* cited by examiner

Primary Examiner—Jerome Jackson
(74) Attorney, Agent, or Firm—Morrison & Foerster LLP

(57) ABSTRACT

A gallium nitride compound semiconductor light emitting element has a nitride layered body formed on a translucent substrate. A P type pad electrode, an N type pad electrode and a P type electrode are formed at the layered body, each having the desired reflectance. The thickness of the translucent substrate and the nitride layered body stacked thereon of the semiconductor light emitting element is 60 $\mu$m to 460 $\mu$m.

8 Claims, 6 Drawing Sheets

SEMICONDUCTOR LIGHT EMITTING ELEMENT AND SEMICONDUCTOR LIGHT EMITTING DEVICE

BACKGROUND OF THE INVENTION

1. Field of the Invention

The present invention relates to the chip thickness in the layered direction of a compound semiconductor light emitting element chip and the reflectance at the top plane and bottom plane of the chip, wherein the compound semiconductor light emitting element is layered on a translucent substrate. The present invention particularly relates to a light emitting element from which high light output is obtained.

2. Description of the Background Art

FIG. 6 is a schematic sectional view of a chip of a conventional light emitting element structure. On a translucent substrate 100, an N type nitride compound semiconductor layer 200, a P type nitride compound semiconductor layer 300, a P type translucent electrode 400, a P type pad electrode 500 and an N type pad electrode 600 are arranged. The translucent substrate 100 side is placed at the cup bottom of a lead frame using paste. In FIG. 6, d denotes the chip thickness of the translucent substrate 100 and the layered body stacked thereon. The arrow in the chip represents the guided wave of light generated inside the chip. Regarding the chip thickness, Japanese Patent Laying-Open No. 5-343742, for example, discloses the adjustment of the thickness of a sapphire substrate to 50 to 300 $\mu$m in a chip fabrication method.

In the above conventional light emitting element, the light generated at the light emitting layer within the chip is emitted outside through P type translucent electrode 400 located at the top of the layered body for usage. Therefore, P type translucent electrode 400 must have transmittance with respect to the generated light. However, P type translucent electrode 400 is formed of a thin metal film. Therefore, the transmittance at P type translucent electrode 400 is only approximately 50% to 70% (30% to 50% in reflectance). The light generated at the light emitting layer is partially lost when emitted outside of the light emitting element. The light output from the element is weak. Only light of low intensity could be obtained. The light emitted from the light emitting layer is also issued downwards (here, towards the substrate) and laterally in addition to the upwards direction, i.e., towards P type translucent electrode 400. As indicated by the arrow in FIG. 6, some of the light emitted from the light emitting layer advances downwards to be reflected at the bottom of the substrate, and then partially reflected again at the top P type translucent electrode 400 to advance downwards again towards the substrate. Thus, light travels in a repetitious manner thereof. This means that the light to be emitted outwards will be blocked by P type translucent electrode 400 (reflectance R1) or P type pad electrode 500. Also, the light reflected at the backside of the substrate (reflectance R3) to advance upwards is also blocked by N type pad electrode 600 (reflectance R2). Thus, multiple reflection of the generated light occurs at the top plane of the conventional light emitting element where the electrode is formed and at the backside of the substrate, so that light will not be easily output from the light emitting element. There is also the problem that the light is absorbed at the P type electrode or N type electrode to result in reduction of the light output. The light emitting element of the conventional structure had the disadvantage that the output of the entire light generated from the light emitting layer is reduced.

SUMMARY OF THE INVENTION

In view of the foregoing, an object of the present invention is to provide greater light output from a light emitting element.

According to an aspect of the present invention, a semiconductor light emitting element has an n type semiconductor layer, a light emitting layer, a p type semiconductor layer, and a p type electrode formed on a translucent substrate in this order, and is mounted at the substrate side. The present semiconductor light emitting element is characterized in that the reflectance of the p type electrode is 55–100%. By such a structure, formation of a translucent electrode for the p type electrode is dispensable. It is no longer necessary to control the film thickness and transmittance in the formation process. Thus, formation is facilitated. Also, the light towards the substrate will be reflected effectively since the reflectance of the p type electrode is high. Although light will not be emitted from the top plane of the chip when the reflectance of the p type electrode is set to 100%, the light output from the side plane is increased by forming the chip thicker. Therefore, the light from the side plane of the chip can be used. In the present aspect, the light emitting element is preferably configured to have upper and lower electrodes instead of the aforementioned structure that has two electrodes at the top plane. The light emitting element is based on a structure in which light is not blocked by the other electrode in a chip that has a conductive substrate, and the reflectance of the p type electrode is set to 100% so that light from the side plane of the chip can be used more effectively.

The semiconductor light emitting element of the present invention is characterized in that the thickness from the bottom plane of the translucent substrate to the surface of the p type semiconductor layer (also called "chip thickness" hereinafter) is set to the range of 60–460 $\mu$m. By such a structure, light from the light emitting layer can be output effectively from the side plane of the element to improve the light output from the light emitting element.

The p type electrode is formed of a single layer or multilayer of Pd (palladium), Ni (nickel), Pt (platinum), Au (gold), Ag (silver) and the like, or an alloy thereof. By using an electrode thereof, favorable ohmic contact can be obtained.

The semiconductor light emitting element has a reflectance of at least 70% at the backside of the translucent substrate.

In the present specification, the reflectance at the backside of the translucent substrate refers to the reflectance at the backside of the substrate in a state mounted with a chip. Specifically, the reflectance includes, not only the reflectance at the backside of the substrate, but also the reflectance by the silver paste and by the mount member itself when in the state where the semiconductor light emitting element is mounted.

The semiconductor light emitting element is characterized in that a reflective layer is formed at the backside of the substrate.

The reflective layer is formed of a single layer or multilayer of Au (gold), Ti (titanium), Al (aluminum), In (indium), W (tungsten), Hf (hafnium) and the like, or an alloy thereof. By using a reflective layer thereof, the reflectance at the backside of substrate can be increased up to approximately 100%.

The reflective layer is an n type electrode.

The semiconductor light emitting element has the n type electrode formed at the same side as the p type electrode. The reflectance of the n type electrode is 5–100%.

A semiconductor light emitting device of the present invention has the above-described semiconductor light emitting element placed on the mount using silver paste.

In the case where the chip size is reduced to approximately 200 μm square in a light emitting element having a thickness of 60 μm to 300 μm in the layered direction including the thickness of a translucent substrate, a pad electrode of approximately 100 μm in diameter and having an area approximately equal to the area through which light passes is formed at the side opposite to the side where the translucent substrate is present. A pad electrode must have an appropriate area to effect wire-bonding for connection with an external source. If the chip square is reduced down to approximately 200 μm, the ratio of the area of the pad electrode to the entire chip area in plane will become relatively great so as to occupy approximately half the area of the chip. There is a problem that the generated light is blocked by such a pad electrode to reduce light output. In the present invention, light is directed outwards from the side plane of the chip. By setting the thickness in the layered direction including the thickness of the translucent substrate to 60 μm–460 μm even in the case where the chip size is reduced, light output will not be reduced since the area of the side plane of the chip is increased. Reduction in the chip size will also increase the number of obtained chips to allow reduction in the cost of the chip. Therefore, the present invention is advantageous in the application where the chip size is reduced.

Formation of a nitride type semiconductor light emitting element as a layered body on a translucent substrate of 450 μm, for example, in thickness eliminates the need of grinding or polishing the backside of the substrate. There is the advantage that the cost of the chip is further reduced and productivity is extremely improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention will be described in detail based on specific examples. In the present specification, it is envisaged that a gallium nitride type semiconductor includes, for example, $In_xAl_yGa_{1-x-y}N$ ($0 \leq x$, $0 \leq y$, $x+y \leq 1$).

First Embodiment

Figure 1:
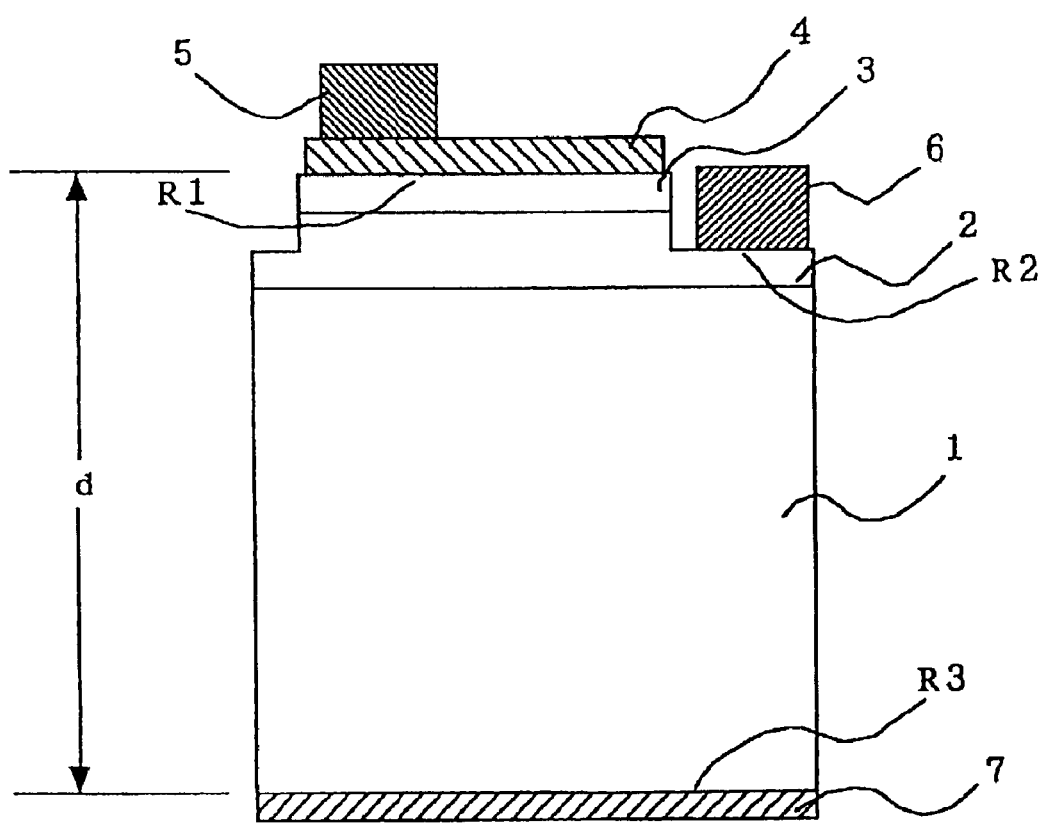
FIGS. 1, 2, 3, and 4 are schematic sectional views of a nitride type semiconductor light emitting element according to a first embodiment, a second embodiment, a third embodiment and a fourth embodiment, respectively, of the present invention.

FIG. 1 is a schematic sectional view of a nitride type semiconductor light emitting element according to a first embodiment of the present invention. On a sapphire substrate 1 which is a translucent substrate, an N type gallium nitride compound semiconductor layer 2 and a P type gallium nitride compound semiconductor layer 3 are stacked. The light emitting element has a thickness of 250 μm, corresponding to sapphire substrate 1, N type gallium nitride compound semiconductor layer 2 and P type gallium nitride compound semiconductor layer 3. A P type electrode 4 and a pad electrode 5 for the P type are formed on P type gallium nitride compound semiconductor layer 3. A pad electrode 6 for the N type is formed on N type gallium nitride compound semiconductor layer 2. A reflective layer 7 is formed at the backside of substrate 1. In FIG. 1, d denotes the chip thickness of 250 μm of the light emitting element.

A method of fabricating the above nitride type semiconductor light emitting element will be described hereinafter.

By means of, for example, metal-organic chemical vapor deposition (referred to as MOCVD hereinafter), N type gallium nitride compound semiconductor layer 2 and P type gallium nitride compound semiconductor layer 3 are sequentially layered on sapphire substrate 1.

The above sapphire substrate 1 is taken out from the MOCVD apparatus. Pd is deposited to a thickness of 7 nm over substantially the entire area of P type gallium nitride compound semiconductor layer 3 as P type electrode 4 to obtain a reflectance R1 of 55%. Then, Au is deposited to a thickness of 500 nm and 100 μm in diameter as P type pad electrode 5. Then, N type gallium nitride compound semiconductor layer 2 is partially etched to expose a surface of N type gallium nitride compound semiconductor layer 2. Sn-added $In_2O_3$ which is a transparent conductor is deposited to a thickness of 150 nm as N type pad electrode 6 on the exposed N type gallium nitride compound semiconductor layer 2 to obtain a reflectance R2 of 5%. Additionally, Ag is deposited to a thickness of 200 nm as reflective layer 7 at the backside of sapphire substrate 1 to obtain a reflectance R3 of 90%. Dividing lines are scribed on sapphire substrate 1 using a diamond stylus. The sapphire substrate wafer is divided into a square of 350 μm in width, whereby a nitride type semiconductor light emitting element is produced as a chip.

It can be considered that the reflectance of the chip in the present embodiment is 55% at the chip top plane, corresponding to the value of reflectance R1, and 90% at the backside of the chip, corresponding to reflectance R3. These values are attributed to the fact that the P type electrode occupies 80–90% of the area of the top plane.

By setting the thickness of the light emitting element to 250 μm in the layered direction including the translucent substrate thickness and setting the reflectance at the backside of sapphire substrate 1 to 90%, the light reflected at the P type electrode from the light generated from the light emitting layer, i.e. the light blocked by the P and N type electrodes here, can be emitted efficiently outside from the side plane of the 250 μm thick layered body including the translucent substrate. Thus, the entire light output emitted from the light emitting element can be increased.

Figure 5:
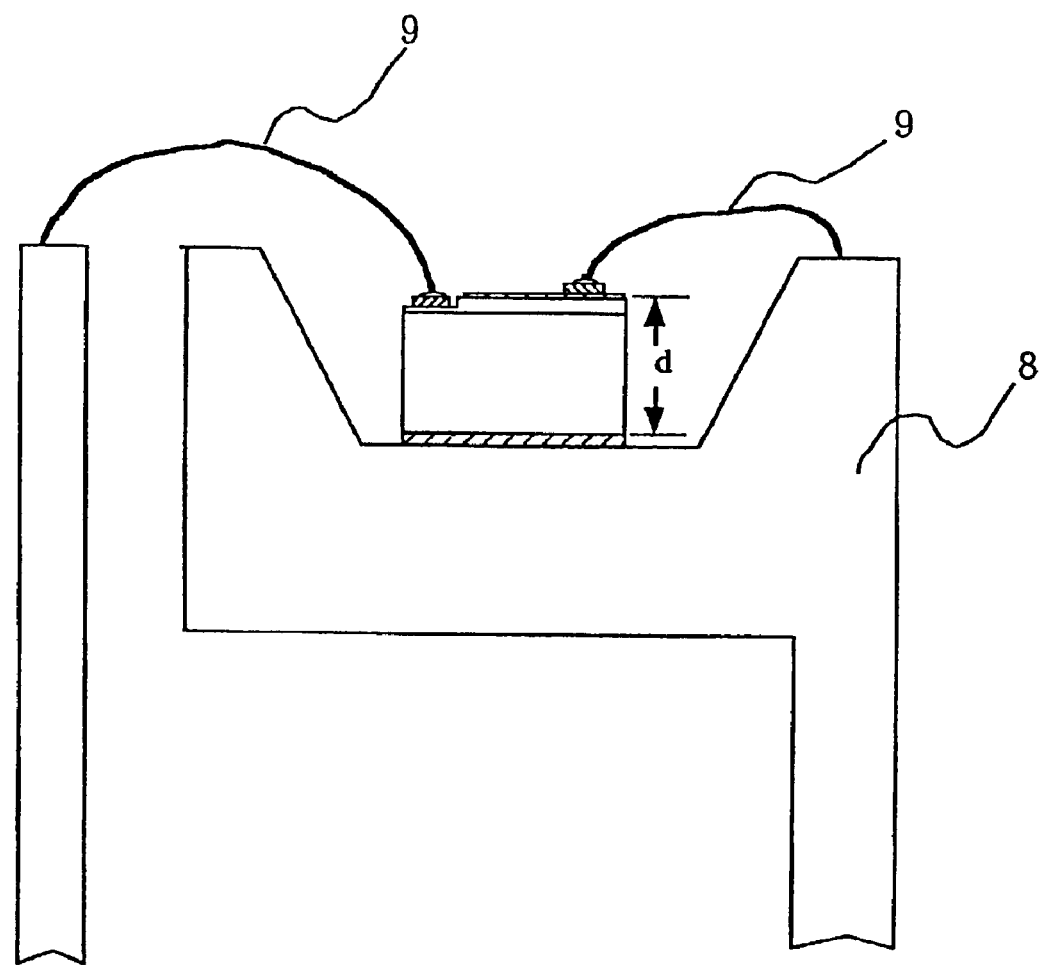
FIG. 5 schematically shows the cup of a lead frame of the first embodiment according to the present invention.
Figure 6:
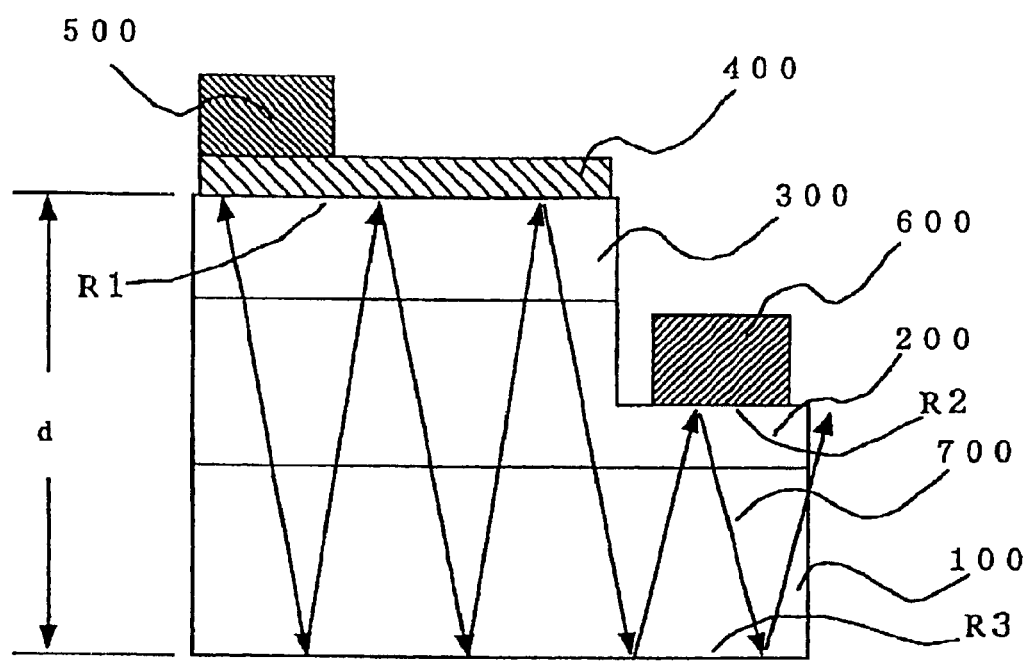
FIG. 6 is a schematic sectional view of a nitride type light emitting element of a conventional structure.

A schematic diagram of the above chip of the present invention placed on the cup portion of a lead frame 8 is shown in FIG. 5. The chip of the present invention is placed at the bottom of the cup using Ag paste. Au wire 9 is connected on the P type pad electrode and the N type pad electrode to supply current to the chip from an external source. Upon supplying a forward current of 20 mA, the light emitted outside efficiently from the side plane of the layered body including the thickness of the translucent substrate is further emitted upwards via the inclination portion of the cup of the lead frame. Therefore, a light output of approximately 3.2 mW is obtained, which is an increase of approximately 40% of the light output 2.3 mW from a chip of the conventional structure having a thickness of 100 µm. On this occasion, a forward voltage of 3.6V is obtained.

Second Embodiment

Figure 2:
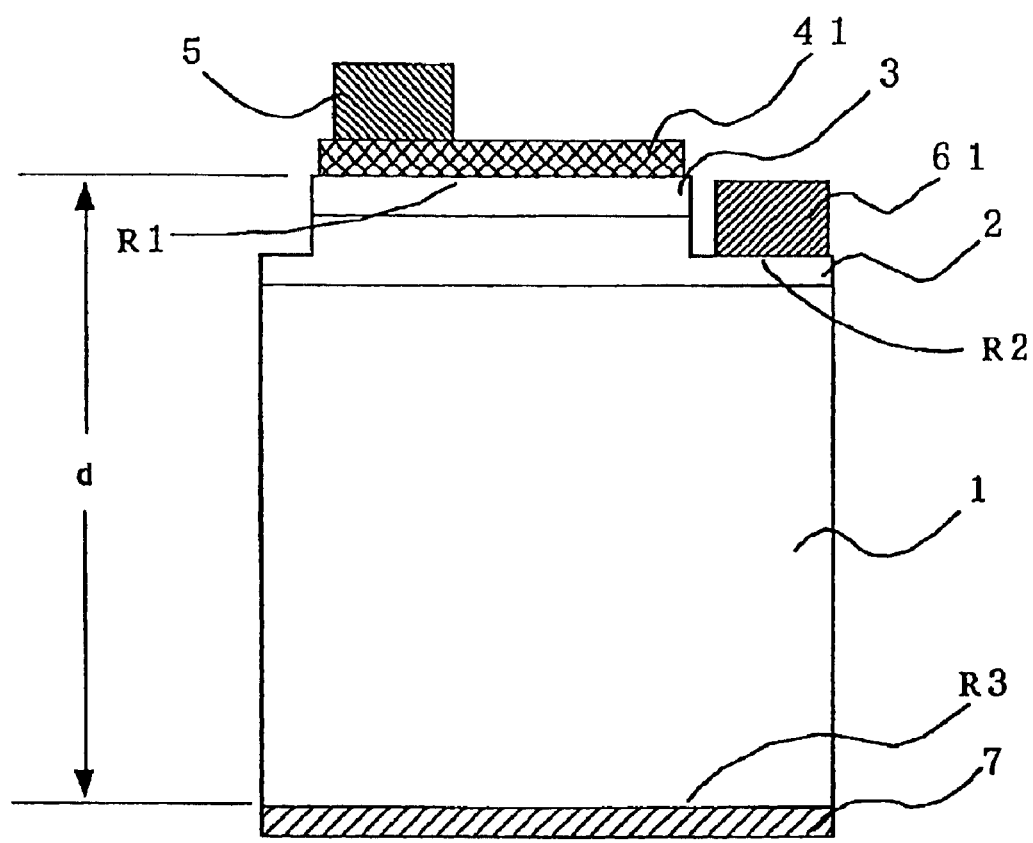

FIG. 2 is a schematic sectional view of a nitride type semiconductor light emitting element according to a second embodiment of the present invention. On a sapphire substrate 1, a N type gallium nitride compound semiconductor layer 2 and a P type gallium nitride compound semiconductor layer 3 are stacked. The light emitting element has a thickness of 350 µm, corresponding to sapphire substrate 1, N type gallium nitride compound semiconductor layer 2 and P type gallium nitride compound semiconductor layer 3. A P type electrode 41 and a pad electrode 5 for the P type are formed at the light emitting element. A pad electrode 61 for the N type is formed on N type gallium nitride compound semiconductor layer 2. A reflective layer 7 is formed at the backside of sapphire substrate 1. In FIG. 2, d denotes the chip thickness of 350 µm of the light emitting element.

The method of fabricating a nitride type semiconductor light emitting element of the present embodiment will be described hereinafter.

By means of, for example, MOCVD, N type gallium nitride compound semiconductor layer 2 and P type gallium nitride compound semiconductor layer 3 are sequentially stacked on sapphire substrate 1.

Sapphire substrate 1 is then output from the MOCVD apparatus. Pd and Ag are deposited to the thickness of 15 nm and 150 nm, respectively, as P type electrode 41 over substantially the entire plane of P type gallium nitride compound semiconductor layer 3 to obtain a reflectance R1 of 90%. Then, Au is deposited to a thickness of 700 nm and a diameter of 110 µm as P type pad electrode 5. Then, N type gallium nitride compound semiconductor layer 2 is partially etched to expose the surface of N type gallium nitride compound semiconductor layer 2. Ti and Al are sequentially deposited to the thickness of 15 nm and 200 nm, respectively, as N type pad electrode 61 on the exposed N type gallium nitride compound semiconductor layer 2 to obtain a reflectance R2 of 90%. Additionally, Ag is deposited to the thickness of 200 nm at the backside of sapphire substrate 1 to obtain a reflectance R3 of 90%.

Dividing lines are scribed at sapphire substrate 1 using a diamond stylus. The sapphire substrate wafer is divided into a square of 300 µm in width to produce a chip of a nitride type semiconductor light emitting element.

Regarding the reflectance of the chip of the second embodiment, it can be considered that reflectance R1 at the chip top plane is 90%, corresponding to the reflectance of P type electrode 41, whereas reflectance R3 at the chip backside is 90%, corresponding to the reflectance of reflective layer 7. By setting the thickness of the light emitting element to 350 µm in the layered direction including the thickness of the translucent substrate, the reflectance R1 of P type substrate 41 to 90% and the reflectance at the sapphire substrate side to 90%, the light incident on P type electrode 41 can be reflected efficiently at the sapphire substrate side. Therefore, light can be emitted efficiently outside from the thick side plane of the layered body including sapphire substrate 1, as in the first embodiment. Thus, the entire light output emitted from the chip can be increased.

Likewise the first embodiment, the above chip is placed as shown in FIG. 5. The chip has the backside of the sapphire substrate where Ag is provided placed at the bottom of the cup of lead frame 8 using Ag paste. In the present embodiment, the sapphire substrate side has Al/Ag paste formed, whereby the reflectance is further increased.

For the purpose of supplying current to the chip from an external source, Au wire 9 is connected on the P type pad electrode and N type pad electrode. Upon supplying a forward current of 20 mA, a light output of approximately 3.5 mW is obtained, which is an increase of approximately 50% of the light output of 2.3 mW from a chip of a conventional structure having a thickness of 100 µm. Also, a forward voltage of 3.2V is obtained.

It is not necessary to form a thin electrode such as the P type translucent electrode of the first embodiment since a thick P type electrode 41 is formed. Therefore, the electrode fabrication method is extremely simplified, which in turn simplifies the fabrication method of the light emitting element. Also, since P type electrode 41 can be formed thick, the film resistance of the electrode can be reduced and favorable ohmic contact can be obtained, as compared to the P type translucent electrode of the first embodiment. Accordingly, the forward voltage can be reduced in comparison to that of the first embodiment.

Third Embodiment

Figure 3:
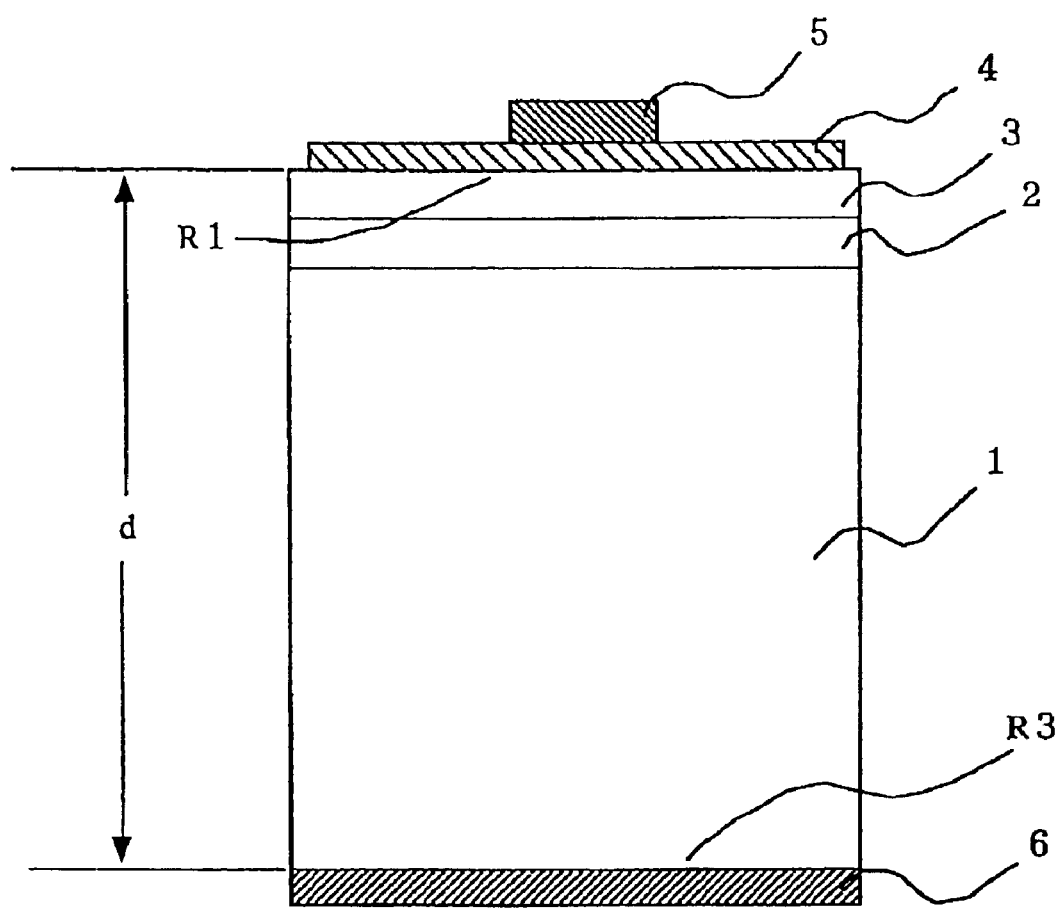

FIG. 3 is schematic sectional view of a nitride type semiconductor light emitting element according to a third embodiment of the present invention. On a GaN substrate 1, an N type gallium nitride compound semiconductor layer 2 and a P type gallium nitride compound semiconductor layer 3 are stacked. The light emitting element has a thickness of 300 µm, corresponding to GaN substrate 1, gallium nitride compound semiconductor layer 2 and P type gallium nitride compound semiconductor layer 3. A P type translucent electrode 4 and a pad electrode 5 for the P type are formed at the light emitting element. An electrode 6 for the N type is formed on GaN substrate 1. In FIG. 3, d denotes the chip thickness 300 µm of the light emitting element.

A method of fabricating the nitride type semiconductor light emitting element of the present embodiment will be described hereinafter.

By means of, for example, MOCVD, N type gallium nitride compound semiconductor layer 2 and P type gallium nitride compound semiconductor layer 3 are sequentially stacked on GaN substrate 1.

GaN substrate 1 is taken out from the MOCVD apparatus. Pd is deposited to a thickness of 7 nm as P type translucent electrode 4 over substantially the entire plane of P type gallium nitride compound semiconductor layer 3 to obtain a reflectance R1 of 55%. Also, Au is deposited to the thickness of 500 nm and a diameter of 120 µm as P type pad electrode 5. Then, Ti, Al and Ag are sequentially deposited to the thickness of 35 nm, 50 nm and 200 nm, respectively, as N type electrode 6 at the backside of GaN substrate 1 to obtain a reflectance R3 of 90%.

Dividing lines are scribed at GaN substrate 1 using a diamond stylus. The wafer of GaN substrate 1 is divided into a square of 350 µm in width to produce a chip of a nitride type semiconductor light emitting element.

As to the reflectance of the chip of the third embodiment, it is considered that the reflectance at the chip top plane is 55%, corresponding to the electrode reflectance value R1, and the reflectance at the chip bottom plane is 90%, corresponding to reflectance R3.

By setting the thickness of the light emitting element to 300 µm in the layered direction including the translucent substrate thickness and setting the reflectance at the translucent substrate side to 90%, the light reflected at the P type electrode among the light generated from the light emitting layer, i.e., the light blocked by the P type electrode, can be emitted outside efficiently from the side plane of the layered body including the translucent substrate thickness. Therefore, the entire light output emitted outside from the chip can be increased.

The chip of the third embodiment is placed at the cup of lead frame 8, as shown in FIG. 5. The chip is placed at the bottom of the cup using an Ag paste adhesive. Au wire 9 is connected onto the P type pad electrode in order to supply current to the chip from an external source. Upon supplying a forward current of 20 mA, a light output of approximately 3.5 mW is obtained, which is an increase of approximately 50% of the light output from a conventional structure. Here, the forward voltage of 3.4V is obtained.

Fourth Embodiment

Figure 4:
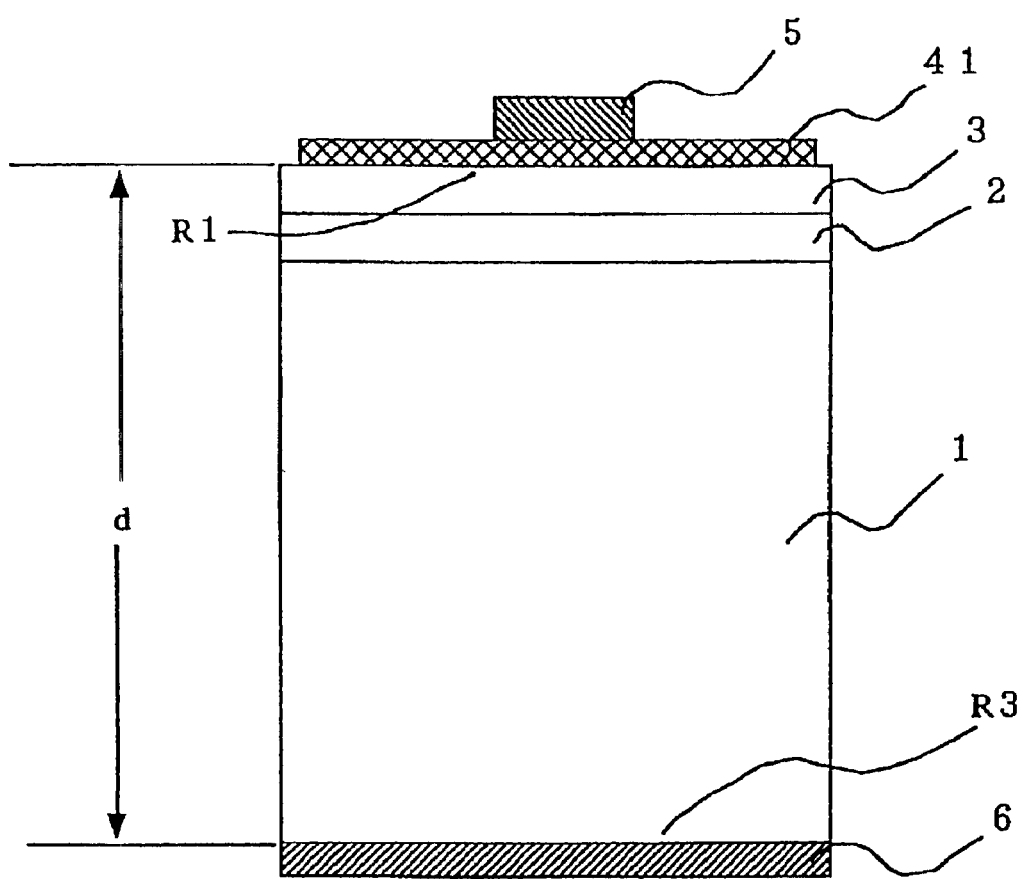

FIG. 4 is a schematic sectional view of a nitride type semiconductor light emitting element according to a fourth embodiment of the present invention. On a GaN substrate 1, an N type gallium nitride compound semiconductor layer 2 and a P type gallium nitride compound semiconductor layer 3 are stacked, all corresponding to a light emitting element having a thickness of 450 $\mu$m. A p type electrode 41 and a P type pad electrode 5 are formed at the light emitting element. An N type electrode 6 is formed at GaN substrate 1. In FIG. 4, d indicates the chip thickness of 450 $\mu$m of the light emitting element.

A method of fabricating a nitride type semiconductor light emitting element of the present embodiment will be described hereinafter.

By means of, for example, MOCVD, n type gallium nitride compound semiconductor layer 2 and P type gallium nitride compound semiconductor layer 3 are sequentially stacked on GaN substrate 1.

GaN substrate 1 is taken out from the MOCVD apparatus. Pd and Ag are deposited to the thickness of 10 nm and 150 nm, respectively, as p type electrode 41 over substantially the entire plane of P type gallium nitride compound semiconductor layer 3 to obtain 90% as reflectance R1. Then, Au is deposited to a thickness of 500 nm and a diameter of 100 $\mu$m as P type pad electrode 5. Then, Hf and Ag are sequentially deposited to the thickness of 15 nm and 200 nm, respectively, as N type electrode 6 at the backside of GaN substrate 1 to obtain 90% as reflectance R3.

Dividing lines are scribed at GaN substrate 1 using a diamond stylus. The wafer of GaN substrate 1 is divided into a square of 200 $\mu$m in width, whereby a nitride type semiconductor light emitting element is produced as a chip.

As to the reflectance of the chip, it is considered that the reflectance at the top plane is 90%, corresponding to reflectance R1 of the electrode, and the reflectance at the chip backside is 90%, corresponding to reflectance R3.

By setting the thickness of the light emitting element to 450 $\mu$m in the layered direction including the translucent substrate thickness and the reflectance at the translucent substrate side to 90%, the light reflected at the P type electrode among the light generated from the light emitting layer, i.e., the light blocked by the P type electrode, can be emitted efficiently outside from the side plane of the layered body including the thickness of the translucent substrate. Therefore, the total light amount emitted outside the chip can be increased.

The chip of the fourth embodiment is placed at the cup bottom of lead frame 8 using an Ag paste adhesive, as shown in FIG. 5. An Au wire 9 is connected onto the P type pad electrode in order to supply current to the chip from an external source. Upon supplying a forward current of 20 mA, a light output of approximately 3.7 mW is obtained, which is an increase of approximately 60% of the light output 2.3 mW from a chip having a conventional structure of 100 $\mu$m in thickness. Also, a forward voltage of 3.1V is obtained.

By setting the thickness of the layered body including the GaN substrate thickness to 450 $\mu$m, the light blocked by the P type electrode can be emitted outside efficiently from the side plane of the layered body including the thickness of the translucent substrate even in the case where the chip is reduced in size. Therefore, the light output will not be degraded. The chip size can be reduced to increase the number of obtained chips, whereby the chip cost can be lowered.

In the present embodiment, the above-described film thickness can be set with the backside of the substrate ground or polished as the so-called mirror plane. Alternatively, the backside of the substrate does not have to be ground or polished, as long as the thickness is within the aforementioned range. The reflective layer or N type electrode may be formed at the backside of the substrate.

The above description is based on a gallium nitride semiconductor such as $In_xAl_yGa_{1-x-y}N$ ($0 \leq x, 0 \leq y, x+y \leq 1$). However, a structure employing As or P as the group V elements may also be employed. Furthermore, the layered body may take a single hetero structure or a double hetero structure, and the light emitting layer may take a single quantum well structure or a multi quantum well structure.

By setting the chip thickness to 60 $\mu$m–460 $\mu$m in a nitride semiconductor light emitting element having an electrode or a reflective layer formed with the reflectance of 55%–100% at the plane side opposite to the side where the substrate is located and a reflectance of at least 70% at the backside of the substrate, the generated light can be emitted efficiently outside from the side plane of the light emitting element without being blocked by the P type pad electrode, the P type translucent electrode and the N type pad electrode formed at the light emitting element. Therefore, a light output increased by approximately 60% than that of a conventional structure can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting element having an N type semiconductor layer, a light emitting layer, a P type semiconductor layer, and a P type electrode formed on a translucent substrate in this order, and mounted at the substrate side, wherein said p type electrode covers substantially an entire area of said P type semiconductor layer, said P type electrode has a reflectance of 55 to 100%, light is emitted outward from a side plane, and said semiconductor light emitting element comprising said translucent substrate, said P type semiconductor layer and said N type semiconductor layer, has a total thickness in a range of 60 to 460 $\mu$m.

2. The semiconductor light emitting element according to claim 1, wherein said P type electrode is formed of a single layer or a multilayer selected from the group consisting of Pd (palladium), Ni (nickel), Pt (platinum), Au (gold), and Ag (silver), or an alloy thereof.

3. The semiconductor light emitting element according to claim 1, wherein said semiconductor light emitting element has a reflectance of at least 70% at a backside of said translucent substrate.

4. The semiconductor light emitting element according to claim 3, wherein said semiconductor light emitting element has a reflective layer formed at the backside of said substrate.

5. The semiconductor light emitting element according to claim 4, wherein said reflective layer is formed of a single layer or a multilayer selected from the group consisting of Ti (titanium), Al (aluminum), In (indium), W (tungsten), and Hf (hafnium), or an alloy thereof.

6. The semiconductor light emitting element according to claim 4, wherein said reflective layer is an N type electrode.

7. The semiconductor light emitting element according to claim 1, wherein said semiconductor light emitting element has an N type electrode formed at a same side as said P type electrode, and said N type electrode has a reflectance of 5 to 100%.

8. A semiconductor light emitting device having the semiconductor light emitting element defined in claim 1 placed on a mount using silver paste.

* * * * *